United States Patent
Cok et al.

(10) Patent No.: US 8,207,954 B2
(45) Date of Patent: Jun. 26, 2012

(54) DISPLAY DEVICE WITH CHIPLETS AND HYBRID DRIVE

(75) Inventors: Ronald S. Cok, Rochester, NY (US); John W. Hamer, Rochester, NY (US); Janos Veres, Pittsford, NY (US)

(73) Assignee: Global OLED Technology LLC, Herndon, VA (US)

( * ) Notice: Subject to any disclaimer, the term of this patent is extended or adjusted under 35 U.S.C. 154(b) by 850 days.

(21) Appl. No.: 12/272,043

(22) Filed: Nov. 17, 2008

(65) Prior Publication Data

US 2010/0123694 A1    May 20, 2010

(51) Int. Cl.
    *G06F 3/038* (2006.01)
(52) U.S. Cl. .......................... 345/205; 345/206
(58) Field of Classification Search ............... 345/92, 345/207, 205, 206; 348/294
    See application file for complete search history.

(56) References Cited

U.S. PATENT DOCUMENTS

| | | | |
|---|---|---|---|
| 5,340,978 A * | 8/1994 | Rostoker et al. | 250/208.1 |
| 6,384,529 B2 | 5/2002 | Tang et al. | |
| 6,582,980 B2 * | 6/2003 | Feldman et al. | 438/28 |
| 6,606,079 B1 * | 8/2003 | Smith | 345/92 |
| 6,919,681 B2 | 7/2005 | Cok et al. | |
| 6,987,355 B2 | 1/2006 | Cok | |
| 7,230,594 B2 | 6/2007 | Miller et al. | |
| 7,492,377 B2 * | 2/2009 | Edwards et al. | 345/694 |
| 2002/0053881 A1 | 5/2002 | Odake et al. | |
| 2004/0239586 A1 | 12/2004 | Cok et al | |
| 2006/0055864 A1 | 3/2006 | Matsumura et al. | |

FOREIGN PATENT DOCUMENTS

| | | | |
|---|---|---|---|
| EP | 0 978 880 A1 | | 2/2000 |
| GB | 2 371 910 | * | 8/2002 |
| GB | 2 371 910 A | | 8/2002 |
| WO | WO 99/41732 | | 8/1999 |

* cited by examiner

*Primary Examiner* — Kevin M Nguyen
*Assistant Examiner* — Sepideh Ghafari
(74) *Attorney, Agent, or Firm* — Morgan, Lewis & Bockius LLP

(57) ABSTRACT

A display device having a hybrid drive including a substrate, a two-dimensional pixel array formed on the substrate, the pixels associated into a plurality of pixel groups. A separate set of group row electrodes and group column electrodes are connected to pixels in pixel groups, so that a single group row electrode together with a single group column electrode drives a single pixel. Two or more chiplets are located over the substrate within the pixel array, each chiplet associated with a pixel group and having connections to each of the associated group row electrodes and associated group column electrodes and having storage elements, the storage element storing a value representing a desired luminance for a pixel and the chiplet using such value to control the desired luminance of each pixel in its associated pixel group.

20 Claims, 3 Drawing Sheets

DISPLAY DEVICE WITH CHIPLETS AND HYBRID DRIVE

CROSS-REFERENCE TO RELATED APPLICATIONS

The present application is related to U.S. application Ser. No. 12/191,462, filed Aug. 14, 2008, by Cok et al., and entitled, "Display Device With Chiplets."

FIELD OF THE INVENTION

The present invention relates to display devices having a single, continuous substrate with distributed, independent control elements that provide a hybrid drive mechanism to an array of display pixel groups formed on the substrate.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels can refer to a single light-emitting element or a group of differently colored light-emitting elements. A variety of flat-panel display technologies are known, for example plasma displays, liquid crystal displays, and light-emitting diode displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can comprise a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display Having Improved Efficiency" by Cok. It is also known to employ a white sub-pixel that does not include a color filter, for example, as taught in U.S. Pat. No. 6,919,681 entitled, "Color OLED Display With Improved Power Efficiency" by Cok et al. A design employing an unpatterned white emitter has been proposed together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al.).

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the intersections between the row and column electrodes form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, a passive-matrix drive device is limited in the number of rows (or columns) that can be included in the device since the sequential nature of the row (or column) driving creates flicker. If too many rows are included, the flicker can become perceptible. Moreover, the currents necessary to drive an entire row (or column) in a display at a desired frame rate can be problematic and limits the physical size of a passive-matrix display.

In an active-matrix device, active control elements are formed of thin-films of semiconductor material, for example amorphous or poly-crystalline silicon, and distributed over the flat-panel substrate. Typically, each sub-pixel is controlled by one control element and each control element includes at least one transistor. For example, in a simple active-matrix organic light-emitting (OLED) display known in the art, each control element includes two transistors (a select transistor and a power transistor) and one capacitor for storing a charge specifying the luminance of the sub-pixel. Each light-emitting element typically employs an independent control electrode and a common electrode. Control of the light-emitting elements is typically provided through a data signal line, a select signal line, a common power connection and a common ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials.

Employing an alternative control technique, Matsumura et al. in US Patent Publication No. 2006/0055864 describes crystalline silicon substrates used for driving LCD displays. The application describes a method for selectively transferring and affixing pixel-control devices made from first semiconductor substrates onto a second planar display substrate.

Wiring interconnections within the pixel-control device and connections from busses and control electrodes to the pixel-control device are shown.

Whether active-matrix or passive-matrix control is used, it is difficult to form large-format displays. If an active-matrix design is employed, forming a uniform film of semiconductor material over a large substrate is difficult and costly. If a passive-matrix design is used, there are limitations on the signal line sizes due to impedance over large areas as well as limitations on the number of rows or columns due to flicker. One approach to designing large-format displays is to use tiles that are each much smaller than the large-format display. Each tile can have individual control elements, either passive or active. For example, International Patent Publication No. WO 99/41732 describes an array of passively controlled tiles. However, the edges between the tiles form visible seams that decrease image quality and are unsatisfactory to viewers.

SUMMARY OF THE INVENTION

The need is met in one embodiment of the present invention by a display device having a hybrid drive, comprising: a) a substrate; b) a two-dimensional pixel array formed on the substrate, the pixels associated into a plurality of pixel groups, each pixel group including at least four pixels and including a separate set of group row electrodes and group column electrodes connected to and driving only the pixels in the corresponding group, each of the group row electrodes connected to two or more pixels and each of the group column electrodes connected to two-or-more pixels, so that a single group row electrode together with a single group column electrode drives a single pixel; and c) two or more chiplets located over the substrate within the pixel array, each chiplet associated with a pixel group and having connections to each of the associated group row electrodes and associated group column electrodes and having at least as many storage elements as are in either dimension of the pixel group, the storage element storing a value representing a desired luminance for a pixel and the chiplet using the value to control the desired luminance of each pixel in its associated pixel group.

ADVANTAGES

The present invention has the advantage that, by providing a display device with chiplet drivers having row and column electrode connections for driving pixels associated into separate groups, the number of connection pads, the number and size of the chiplets, and the cost of the chiplets are all reduced.

Figure 1:
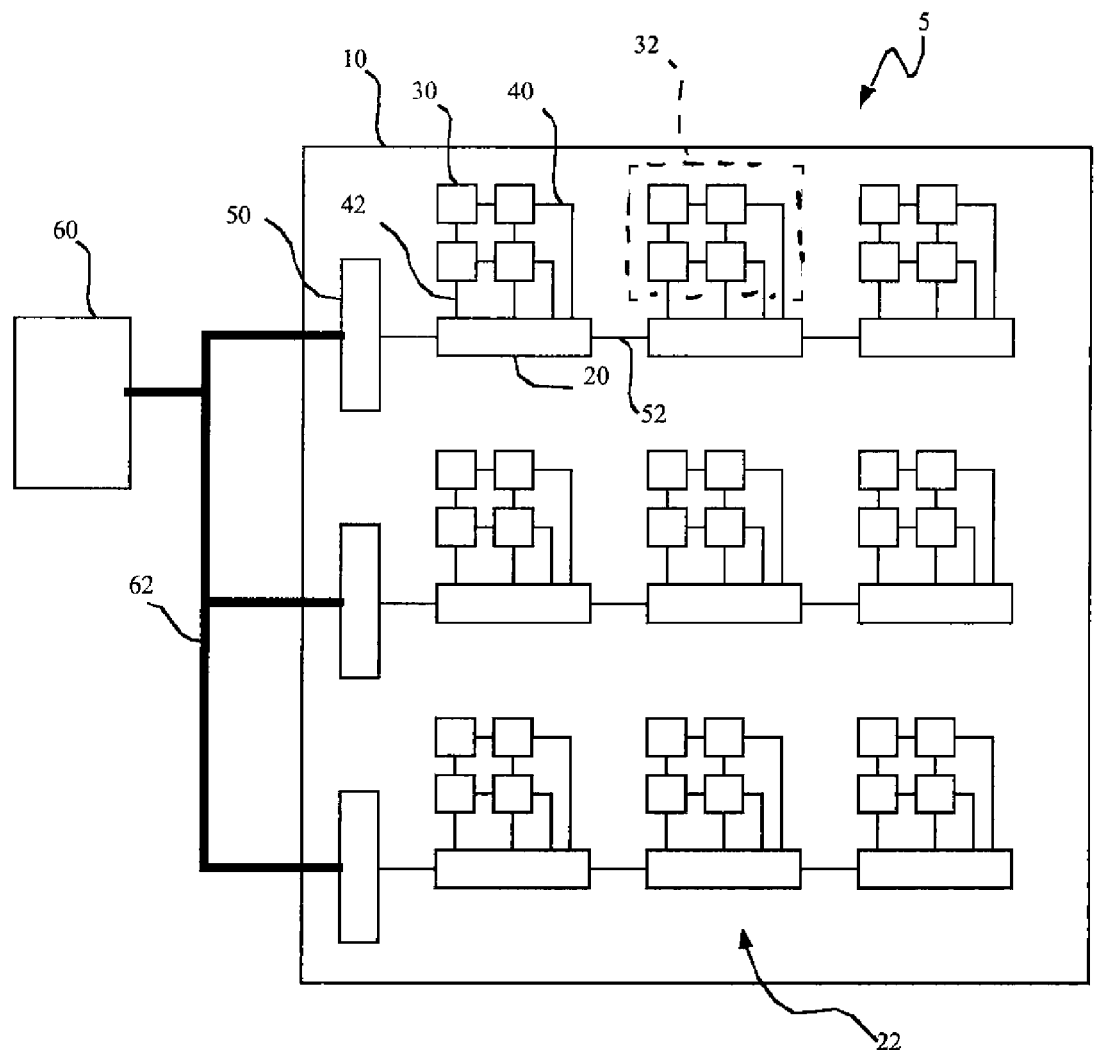
FIG. 1 is a schematic of a display device having a plurality of chiplets and associated pixel groups according to an embodiment of the present invention.

Because the various layers and elements in the drawings have greatly different sizes in the various embodiments, the drawings are not to scale.

DETAILED DESCRIPTION OF THE INVENTION

In one embodiment, the present invention comprises an imaging device having a hybrid drive. The imaging device can be, for example, an image display device (e.g. an emissive device) or an image capture device (e.g. a light-sensitive device). A hybrid drive, as disclosed herein, is a means for controlling the luminance of an array of light-emitting elements that combines attributes of both passive-matrix and active-matrix control. Referring to FIG. 1, the imaging device 5 comprises a single, continuous substrate 10. A two-dimensional pixel array is formed on the substrate 10, the pixels 30 associated into a plurality of pixel groups 32, each pixel group 32 including at least four pixels 30 and including a separate set of group row electrodes 40 and group column electrodes 42 connected to and driving only the pixels 30 in the corresponding pixel group 32, each of the group row electrodes 40 connected to two or more pixels 30 and each of the group column electrodes 42 connected to two or more pixels 30, so that a single group row electrode 40 together with a single group column electrode 42 drives a single pixel 30. Two or more chiplets 20 are located over the substrate 10 within the pixel array, each chiplet 20 associated with a pixel group 32. Chiplets 20 are typically bare semiconductor die, e.g. crystalline silicon, and do not have additional packaging, e.g. plastic or ceramic, with pin connections.

As shown in FIG. 1, nine chiplets 20 are shown in a 3 by 3 array over the substrate 10 within the pixel array. However, the chiplets 20 could be arranged in a one-dimensional array and the pixel groups 32 likewise arranged in a one-dimensional array. The phrase "within the pixel array" 32 is defined herein to mean that the chiplets 20 are not located around the periphery of the pixel array 32, but rather found within the substrate area of the pixel array. The chiplets 20 can be in a common layer with the pixels 30 in the pixel array or can be in a different layer between the substrate 10 and a pixel layer, or a pixel layer can be between the substrate 10 and the chiplets 20. The imaging device is formed on a single, continuous substrate 10 and does not comprise separate, independently constructed tiles.

The two-dimensional array of pixels 30 can include all of the pixels 30 in an imaging device 5, or could include a subset of the pixels in the device, for example an x by y array of pixels 30. Each pixel group 32 within the pixel array can then have m by n pixels 30, where m<x and n<y. Typically, m=x/a and n=y/b where a×b is the number of chiplets 20. Either a or b can be one, but not both. It is helpful if a divides x exactly and b divides y exactly so that each chiplet has the same number of m×n pixels. It is also helpful if each chiplet has the same number of pixels in each row and column as all other chiplets (i.e. m and n have the same value for each chiplet). Pixel groups can have dimensions that are a multiple of two, for example 64, 128, 256, 512, or 1024, so long as the pixel group dimensions are smaller than (and preferably evenly divide) the corresponding dimension of the pixel array. It has been found helpful, in one exemplary design, to use a 16-row by 16-column array with a chiplet controller.

Figure 2:
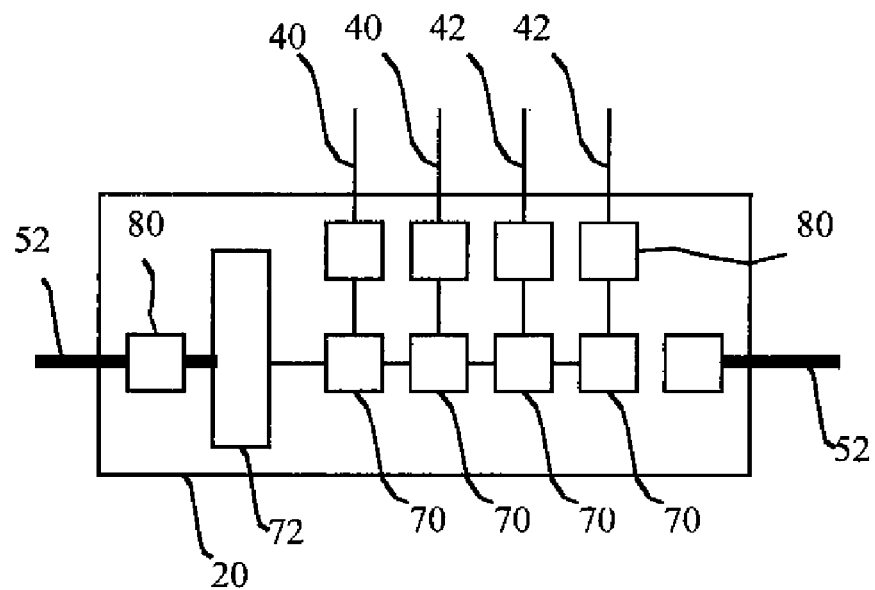
FIG. 2 is a schematic of chiplet circuitry according to an embodiment of the present invention.

Referring to FIG. 2, each chiplet 20 has connections to each of the associated group row electrodes 40 and associated group column electrodes 42 and has a storage element 70 for at least as many pixels as are in either dimension of the pixel group 32, the storage element 70 storing a value representing a desired luminance for a pixel and the chiplet 20 using such value to control the desired luminance of each pixel 30 in its associated group 32. Connection pads 80 can be employed to connect chiplet 20 circuitry to the group row and column electrodes 40, 42, respectively. A chiplet interconnection buss 52 can be employed to communicate signals to the chiplets 20 and a chiplet controller 72 can control the interconnection buss 52, storage elements 70, and the corresponding light-emitting elements through group row and group column electrodes 40, 42. The interconnection buss 52 can communicate either serially or in parallel and is connected to a chiplet 20 through a connection pad 80. The interconnection buss 52 can be daisy-chained from one chiplet 20 to another chiplet 20, or can be separately connected to all chiplets 20 in common.

As shown in FIG. 2, the chiplet 20 has a storage element 70 for each pixel 30 in the pixel group 32. However, according to an embodiment of the present invention, the pixel group 32 has two dimensions and the number of storage elements 70 must be at least as large as the smaller of the two dimensions of the pixel group 32. In the embodiment of FIG. 1, the pixel group 32 has two rows and two columns so that the chiplet 20 must have at least two storage elements 70. Information, for example image information, is deposited in the storage elements 70 corresponding to the pixel 30 for the row (or column) that is to be activated. At least one row (or column) of information can be deposited and displayed in one communication step. Alternatively, an entire pixel group 32 of information can be deposited. In an exemplary embodiment of the present invention, the chiplet 20 has at least two storage elements 70 for each pixel 30 to be displayed in one communication step so that information can be deposited in one of the two storage elements 70 while the information stored in the second of the two storage elements 70 is displayed on a row or column of the pixel group 32.

Figure 3:
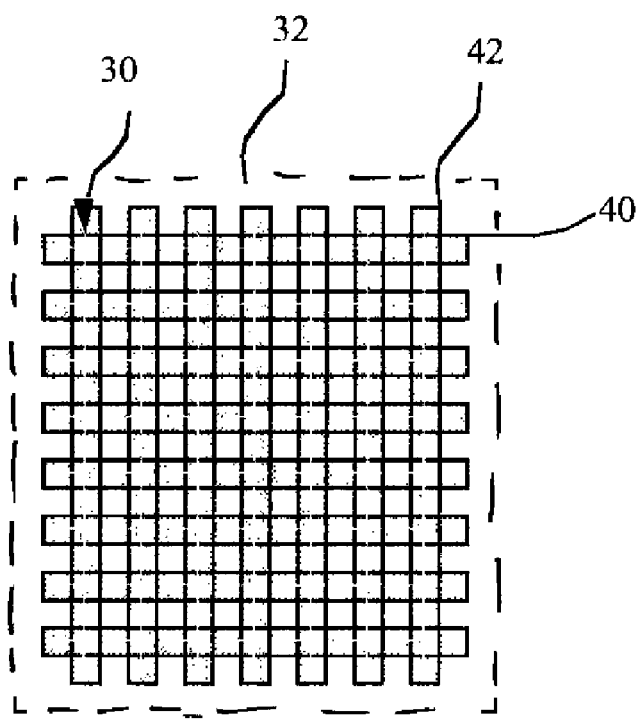
FIG. 3 is a plan view of a pixel group with row and column electrodes according to an embodiment of the present invention.
Figure 4:
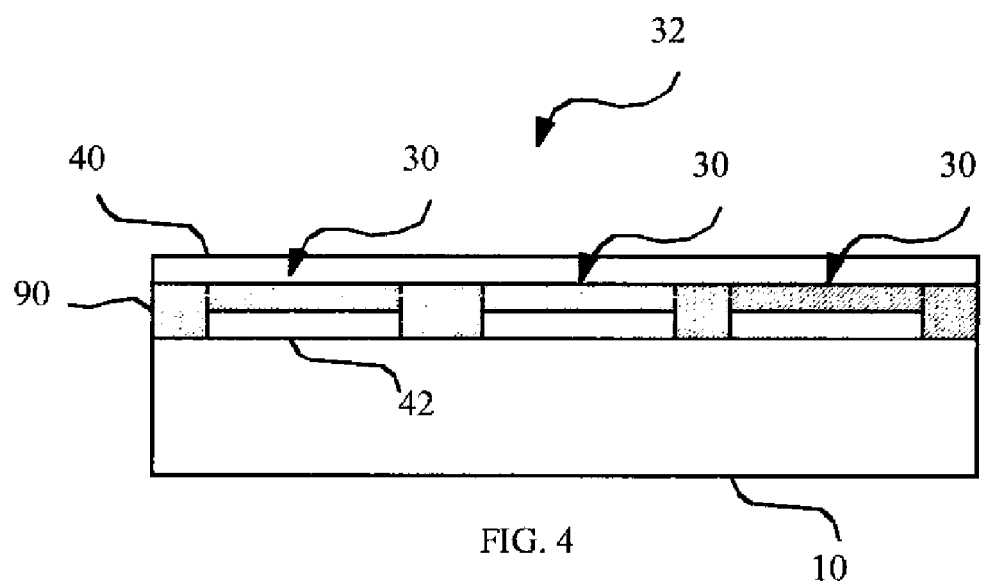
FIG. 4 is a partial cross-section of one row of light-emitting elements in a pixel group having row and column electrodes according to an embodiment of the present invention.

Referring to FIG. 3, a pixel group 32 can form an array of light-emitting elements or pixels 30, for example a rectangular array. Each pixel 30 is formed by the overlapping intersection of group row electrodes 40 and group column electrodes 42. Referring to FIG. 4, in a partial cross-section of one row of a pixel group 32, group column electrodes 42 are formed over a substrate 10. The group column electrodes 42 are coated with one or more layers of material, at least one of which is light-emitting and can comprise organic, inorganic, or combinations of organic and inorganic materials. The layers of material 90 are then coated with a group row electrode 40 to form a row of light-emitting pixel elements 30 delineated by a dashed line.

As shown in FIG. 1, each chiplet 20 can be connected by one or more serial or one or more parallel busses 52, or both, for providing control signals to the pixels 30 associated with the chiplet 20. The busses 52 can be point-to-point, connected in parallel, or daisy-chained. At least one buss 52 can be connected to all of the chiplets 20 in one column of the chiplet array 22 or at least one buss 52 can be connected to all of the chiplets 20 in one row of the chiplet array 22.

The busses 52 can supply a variety of signals, including timing (e.g. clock) signals, data signals, select signals, power connections, or ground connections. The signals can be analog or digital, for example digital addresses or data values. Analog data values can be supplied as charge. The storage elements 70 can be digital (for example comprising flip-flops) or analog (for example comprising capacitors for storing charge). Busses 52 can be formed by a variety of methods, for example photolithography, laser maskless technologies, or additive technologies such as inkjet.

In various embodiments of the present invention, the chiplets 20 distributed over the substrate 10 can be identical. However, a unique identifying value, i.e. an ID, can be associated with each chiplet 20. The ID can be assigned before or, preferably, after the chiplet 20 is located over the substrate 10 and the ID can reflect the relative position of the chiplet 20 on the substrate 10, that is, the ID can be an address.

In a further embodiment of the present invention, one or more additional control chiplets 50 (FIG. 1) can be employed to control the imaging device 5. These additional control chiplets 50 can be located on the same substrate 10 as the pixels 30 and chiplets 20, for example on the periphery of the substrate 10, or can be external to the substrate 10. The additional control chiplets 50 can provide additional control to imaging device 5 and can employ additional control busses 62 to communicate with and control the chiplets 20 and pixels 30.

According to one embodiment of the present invention, the size of each chiplet 20 is determined by the number of connections to the chiplet 20 and, especially, by the number of connection pads 80 on each chiplet 20. As disclosed in the above-referenced application (U.S. patent application Ser. No. 12/191,462), for example, a chiplet 20 that directly controls each pixel 30 through an individual control electrode requires a separate electrode (and connection pad) for each pixel 30. A chiplet 20 that controls four multi-element pixels, each multi-element pixel having four light-emitting pixel elements 30 in a red, green, blue, white configuration, thus employs 16 connection pads to control the light-emitting pixel elements 30. However, according to an embodiment of the present invention, the chiplet 20 can employ, instead, only 8 connection pads, four group column electrodes 42 and four group row electrodes 40, for a savings of 8 connection pads 80 and consequently reducing the size and cost of the chiplet 20. In a second example, according to an embodiment of the present invention a pixel group 32 with 64 pixels 30 having an 8 by 8 array of pixels 30 can employ only 8 group column electrodes 42 and 8 group row electrodes 40 for a total of 16 connection pads 80 to control the pixels 30 in the pixel group 32. In comparison, the patent application referenced above (U.S. patent application Ser. No. 12/191,462) would require 64 connection pads 80. In a third example, according to an embodiment of the present invention a pixel group 32 with 256 pixels 30 having a 16 by 16 array of pixels 30 can employ only 16 group column electrodes 42 and 16 group row electrodes 40 for a total of 32 connection pads 80 to control the pixels 30 in the pixel group 32. In comparison, the disclosure referenced above would require 256 connection pads 80. In general, the present invention requires only 2n connection pads 80 for each pixel group 32 of $n^2$ pixels 30, rather than $n^2$ connection pads 80.

The present invention can operate as follows. A controller receives a video signal. The controller processes the signal according to the needs of the imaging device and transmits the processed signal through one or more control busses or busses to each chiplet in the chiplet array. The processed signal includes luminance information for each light-emitting pixel element in the pixel group corresponding to the chiplet. Chiplet controller stores the luminance information in a storage element corresponding to each light-emitting pixel element. The controller then drives the luminance information from each storage element corresponding to pixels in a row through connection pads and group column electrodes to the light-emitting pixel elements in that row. Simultaneously a group row electrode is provided with power so that each light-emitting pixel element in the row simultaneously emits light according to the luminance information stored in the corresponding storage element. All of the chiplets can drive a row of its corresponding pixel group simultaneously. Subsequently, a second row in the pixel group can be driven, followed sequentially by other remaining rows of light-emitting pixel elements in the pixel group. Note that, in the present application, the designation of "rows" and "columns" is arbitrary and can be exchanged.

Although the sequential activation of separate rows in a pixel group can induce flicker, because the pixel groups are relatively small compared to the number of pixels in the entire imaging device (depending on the number of chiplets in the chiplet array and the number of pixels in each pixel group), and pixel groups are simultaneously activated, flicker can be greatly reduced. Moreover, because the group row electrodes and group column electrodes are connected only within a pixel group, the group row electrode and group column electrodes are short, reducing the electrode capacitance and resistance and the need for high-power driving circuitry in the chiplet. Hence, the portion of time that each pixel row emits light is increased, flicker is decreased, and current densities decreased at a desired luminance.

According to various embodiments of the present invention, the chiplets can be constructed in a variety of ways, for example with one or two rows of connection pads along a long dimension of a chiplet. The interconnection busses can be formed from various materials and use various methods for deposition on the device substrate. For example, the interconnection busses can be metal; either evaporated or sputtered, for example aluminum, silver, or various metal alloys such as magnesium silver. Alternatively, the interconnection busses can be made of cured conductive inks or metal oxides. In one cost-advantaged embodiment, the interconnection busses are formed in a single layer.

The present invention is particularly useful for multi-pixel device embodiments employing a large device substrate, e.g. glass, plastic, or foil, either rigid or flexible, with a plurality of chiplets arranged in a regular fashion over the device substrate. Each chiplet can control a plurality of pixels formed over the device substrate according to the circuitry in the chiplet and in response to control signals.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are separately manufactured from the display substrate and then applied to the display substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet's circuitry is disposed. The plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate. Chiplets can have a crystalline substrate to provide higher performance active components than are found in, for example, thin-film amorphous or polycrystalline silicon devices. Chiplets can have a thickness preferably of 100 μm or less, and more preferably 20 μm or less. This facilitates formation of the adhesive and planarization material over the chiplet that can then be applied using conventional spin-coating techniques. According to one embodiment of the present invention, chiplets formed on a crystalline silicon substrate are arranged in a geometric array and adhered to a device substrate with adhesion or planarization materials. Connection pads on the surface of the chiplets are employed to connect each chiplet to signal wires, power busses, and row or column electrodes to drive pixels. Chiplets can control one, several, or many pixels. However, it is preferred that each chiplet control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads must be sized based on the feature size of the lithography tools used on the display substrate (for example 5 μm) and the alignment of the chiplets to the wiring layer (for example +/−5 μm). Therefore, the connection pads can be, for example, 15 μm wide with 5 μm spaces between the pads. This means that the pads will generally be significantly larger than the transistor circuitry formed in the chiplet.

The pads can generally be formed in a metalization layer on the chiplet over the transistors. It is desirable to make the chiplet with as small a surface area as possible to enable a low manufacturing cost. Therefore, the size and number of the connection pads and not the transistors will generally limit the size of the chiplet.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced so that the chiplet size is determined by the number and spacing of connection pads necessary to control and power the device. A useful chiplet can also be formed using micro-electromechanical (MEMS) structures, for example as described in "A novel use of MEMs switches in driving AMOLED," by Yoon, Lee, Yang, and Jang, Digest of Technical Papers of the Society for Information Display, 2008, 3.4, p. 13.

The device substrate can comprise glass and the wiring layers made of evaporated or sputtered metal, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to Van Slyke et al. Inorganic devices, for example, employing quantum dots formed in a polycrystalline semiconductor matrix (for example, as taught in US Patent Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture. The present invention can be used for emissive display devices but also for other display devices, for example LCDs. The present invention can also be useful for light-responsive devices, for example large-substrate imaging devices, for example those that employ penetrating radiation.

The invention has been described in detail with particular reference to certain preferred embodiments thereof, but it should be understood that variations and modifications could be effected within the spirit and scope of the invention.

PARTS LIST 5 imaging device
10 device substrate
20 chiplet
22 chiplet array
30 pixel
32 pixel group
40 row electrode
42 column electrode
50 control chiplet
52 buss
60 controller
62 control buss
70 electrode portion
72 chiplet controller
80 connection pad
90 layers of material

What is claimed is:

1. An imaging device having a hybrid drive, comprising:
   a) a single continuous substrate;
   b) a two-dimensional pixel array formed on the substrate, the pixels associated into a plurality of pixel groups, each pixel group including at least four pixels and including a separate set of group row electrodes and group column electrodes connected to and driving only the pixels in the corresponding pixel group, each of the group row electrodes connected to two or more pixels and each of the group column electrodes connected to two or more pixels, so that a single group row electrode together with a single group column electrode drives a single pixel; and
   c) two or more chiplets located over the substrate and within the pixel array, each chiplet associated with a pixel group and having connections to each of the associated group row electrodes and associated group column electrodes and having at least as many storage elements as are in either dimension of the pixel group, the storage element storing a value representing a desired luminance for a pixel and the chiplet using the value to control the desired luminance of each pixel in its associated pixel group.

2. The imaging device of claim 1, including one or more buses electrically connected to each chiplet.

3. The imaging device of claim 2, wherein at least one of the one or more buses is a serial bus connected serially through at least two or more chiplets.

4. The imaging device of claim 2, wherein at least one of the one or more buses is a parallel bus connected in common to the chiplets.

5. The imaging device of claim 4, wherein the parallel bus provides a power or ground electrical connection.

6. The imaging device of claim 2, wherein a bus transmits a data signal.

7. The imaging device of claim 2, wherein at least one of the one or more bus connections is a parallel bus and at least one of the one or more bus connections is a serial bus.

8. The imaging device of claim 2, wherein at least one of the one or more buses is connected to all of the chiplets in one column of the chiplet array or at least one bus is connected to all of the chiplets in one row of the two or more chiplets.

9. The imaging device of claim 1, wherein each of the pixel groups forms a rectangular array of pixels.

10. The imaging device of claim 1, wherein the storage element is an analog storage element, a capacitor storing charge, or a digital storage element.

11. The imaging device of claim 1, wherein the device is a non-emissive display device.

12. The imaging device of claim 1, wherein the device is an image capture device.

13. The imaging device of claim 1, wherein the chiplets are identical.

14. The imaging device of claim 1, wherein each chiplet has a unique identifier.

15. The imaging device of claim 14, wherein the unique identifier of each chiplet is established after the chiplets are located over the substrate and the unique identifier of each chiplet corresponds to a relative position of each chiplet in the two-dimensional chiplet array.

16. The imaging device of claim 1, further comprising control chiplets located around the periphery of the two or more chiplets for driving the chiplets.

17. The imaging device of claim 1, wherein the size of each chiplet is determined by the number of connections to the chiplet.

18. The imaging device of claim 1, wherein the device is a display device.

19. The imaging device of claim 18, wherein the device is an organic LED display device or an inorganic LED display device.

20. The imaging device of claim 1, wherein each chiplet is connected to at least two group row electrodes and two group column electrodes.

* * * * *